United States Patent
Minelli

(10) Patent No.: US 6,778,388 B1
(45) Date of Patent: Aug. 17, 2004

(54) WATER-RESISTANT ELECTRONIC ENCLOSURE HAVING A HEAT SINK

(75) Inventor: Jeffrey D. Minelli, Olathe, KS (US)

(73) Assignee: Garmin Ltd. (KY)

( * ) Notice: Subject to any disclaimer, the term of this patent is extended or adjusted under 35 U.S.C. 154(b) by 190 days.

(21) Appl. No.: 09/911,009

(22) Filed: Jul. 23, 2001

(51) Int. Cl.$^7$ ................................................. H05K 7/20
(52) U.S. Cl. ...................... 361/690; 165/80.3; 165/185; 257/718; 257/719; 361/704; 361/710; 361/715; 361/752; 361/814; 174/52.3
(58) Field of Search .......................... 331/51; 174/50.5, 174/50.51, 50.54, 52.3, 66, 67; 165/80.3, 185; 361/600, 679, 688, 690, 697, 703–704, 707, 710, 715, 717, 722, 728, 730, 752, 814; 257/718–719, 726–727

(56) References Cited

U.S. PATENT DOCUMENTS

| | | | | |
|---|---|---|---|---|
| 3,369,597 A | * | 2/1968 | Dronsyuth et al. | 361/697 |
| 4,065,727 A | * | 12/1977 | Johnson, Sr. | 331/51 |
| 4,872,102 A | * | 10/1989 | Getter | 361/690 |
| 5,065,278 A | * | 11/1991 | Schultz | 136/690 |
| 5,946,193 A | * | 8/1999 | Hendrix et al. | 361/704 |
| 6,166,905 A | * | 12/2000 | Oyamaada et al. | 361/697 |
| 6,184,468 B1 | * | 2/2001 | Speziale | 174/66 |
| 6,374,912 B1 | * | 4/2002 | LaGrotta et al. | 165/185 |
| 6,396,691 B1 | * | 5/2002 | Pagnozzi | 361/690 |

* cited by examiner

Primary Examiner—Gregory Thompson
(74) Attorney, Agent, or Firm—Devon A. Rolf

(57) ABSTRACT

A device and method for enclosing electronics in a waterproof environment and transferring the heat generated by the electronics to an external environment is provided. The device includes a housing and a heat sink. The housing includes top and bottom pieces that are sealed to one another forming an interior portion. The interior portion houses electronic components. A face plate is coupled to the front of the housing and includes an opening that is sealed with a hinged door. A fastening mechanism securely fastens the heat sink to the housing so that a substantial portion of the heat sink is in contact with the back side of housing. Heat sink includes a base and a plurality of fins that are adapted to transfer heat generated by the electronic components within the interior of the housing to an external environment.

53 Claims, 4 Drawing Sheets

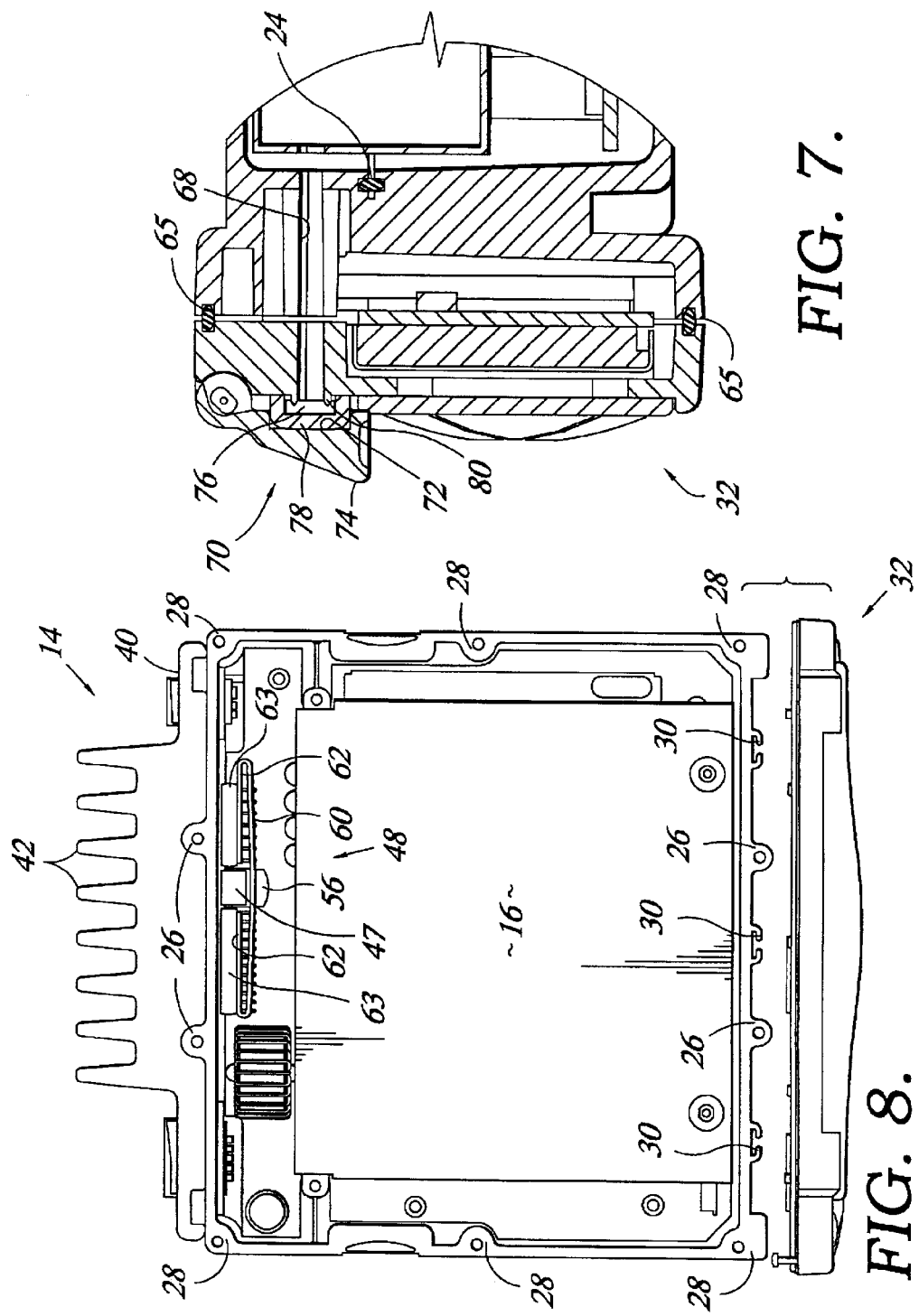

WATER-RESISTANT ELECTRONIC ENCLOSURE HAVING A HEAT SINK

CROSS-REFERENCE TO RELATED APPLICATIONS

Not Applicable.

FIELD OF INVENTION

This invention relates to a enclosure for an electronic device having a heat sink coupled thereto. More particularly, this invention relates to an enclosure for an electronic device which provides a water-tight seal to prevent water from entering the interior of the enclosure while providing for the transfer of heat from the interior portion of the enclosure to an external environment.

BACKGROUND OF INVENTION

Various types of electronic components are used in marine watercraft. For example, boats commonly include electronic devices such as radios, televisions, sonar, radar instruments, communication devices and Global Positioning System (GPS) receivers. Most electronic devices are mounted within some type of an enclosure. During operation, the electronic device usually produces heat that needs to be removed from the enclosure to an external environment If the heat is not removed, the electronic device will overheat. To adequately dissipate the heat produced by the electronic device, prior art enclosures are typically made of metal and include a plurality of vents that allow the heat within the enclosure to escape into the exterior environment.

In a marine environment, it is important to provide a sealed enclosure for the electronic device due to the increased probability of water entering the enclosure and causing permanent damage to the internal components of the device. Certain features of prior art marine electronics have been engineered to prevent water from entering and destroying the internal components of the device. Specifically, prior art electronic enclosures are equipped with devices such as waterproof buttons and plastic shields that cover the front face of the device. Pending U.S. patent application, Ser. No. 09/874,762 filed Jun. 5, 2001 under the title "Water-Tight Closure for an Opening in an Electronic Device" teaches a door that seals cassette and compact disc openings to prevent water from entering the enclosure.

Even though the prior art devices prevent some water from entering the front of the device, such devices suffer various drawbacks and deficiencies. For example, prior art electronic devices have failed to prevent water from entering the cooling vents formed in the enclosure. The vents are typically formed in the top and sides of the enclosure to allow for the dissipation of the heat from the inside of the enclosure. Thus, there is a substantial likelihood that water will enter the enclosure and damage the electronic components.

Accordingly, there remains a need for an enclosure for an electronic device which overcomes the above drawbacks and deficiencies. More specifically, there remains a need for an enclosure for an electronic device that prevents water from entering the interior of the enclosure. Further, there remains a need for an enclosure for an electronic device that transfers heat within the enclosure to an external environment. The objective of this invention is to solve or substantially reduce the problems normally associated with known electronic device enclosures.

SUMMARY OF INVENTION

Accordingly, in one of its aspects, the present invention provides an apparatus for sealing an electronic device and transferring the heat generated by the electronic device to an external environment.

In another of its aspects, the present invention provides a method and apparatus for forming a water-tight seal for an electronic device and transferring the heat generated by the electronic device to an external environment.

According to the present invention, the foregoing and other objects are achieved by an apparatus for enclosing an electronic device in a waterproof environment, the apparatus comprising a housing and a heat sink. The housing is adapted to seal the electronic device within an interior portion of the housing. The heat sink is adapted to be coupled to the housing and transfers heat from the interior of the housing to the external environment.

The present invention further provides an apparatus for waterproofing an electronic device wherein the electronic device produces heat during operation, the apparatus comprising a housing and a heat sink. The housing, preferably made of plastic, has first and second pieces that are adapted to be sealed together to form an interior portion. The interior portion houses electronic devices. The first and second pieces are adapted to prevent water from entering the interior portion. The heat sink is adapted to be coupled to the housing. The heat sink is adapted to transfer the heat that is generated by the electronic device to the external environment.

In particular, in a preferred embodiment of the invention, a regulator and an audio power amplifier are mounted to or proximate an inside well of the housing and are in contact with (or mounted to) the heat sink. The regulator and audio power amp each generate relatively significant heat, and their placement in contact with the heat sink permits this excess heat to be effectively transmitted out of the housing via the heat sink.

The present invention also provides a method for forming a water-tight enclosure for an electronic device, said apparatus includes a housing and a heat sink. The housing is adapted to enclose the electronic device. The heat sink is adapted to be coupled to said housing and allow for the transfer of heat generated by the electronic device within the housing to the external environment. The method comprises the steps of mounting the electronic device in the housing, sealing the housing in such a way to prevent water from entering the housing and coupling the heat sink to the housing.

Additional objects of invention, together with the advantages and novel features appurtenant thereto, will be set forth in part in the description which follows, and in part will become apparent to those skilled in the art upon examination of the following, or may be learned from the practice of the invention. The objects and advantages of the invention may be realized and attained by means and instrumentalities and combinations particularly pointed out in the appended claims.

BRIEF DESCRIPTION OF THE DRAWINGS

In the accompanying drawings which form a part of the specification and are to be read in conjunction therewith and in which like reference numerals are employed to indicate like parts in the various views:

FIG. 7 is an enlarged view of the area encompassed by line "FIG. 7" of FIG. 5 showing the face plate; and FIG. 8 is a plan view of the bottom housing and heat sink shown in FIG. 3 with top housing removed.

DETAILED DESCRIPTION OF THE PREFERRED EMBODIMENT

The present invention is directed toward a waterproof electronic enclosure that provides for the transfer of heat from the inside portion of the enclosure to an external environment. The particular embodiments described herein are intended in all respects to be illustrative rather than restrictive. Alternative embodiments will become apparent to those skilled in the art to which the invention pertains without departing from its scope.

Figure 1:
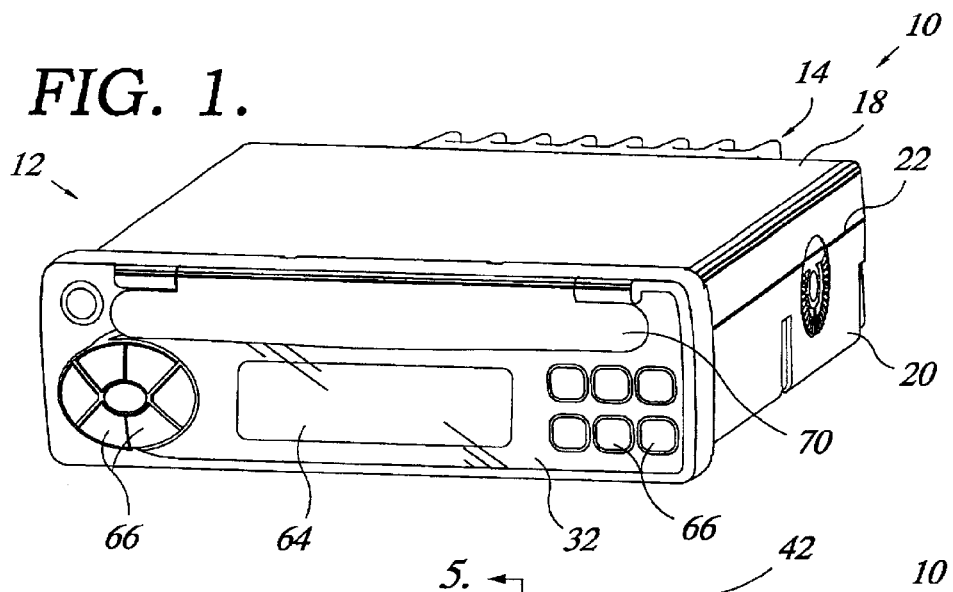
FIG. 1 is a front perspective view of a housing having a heat sink coupled thereto in accordance with a preferred embodiment of the present invention.
Figure 2:
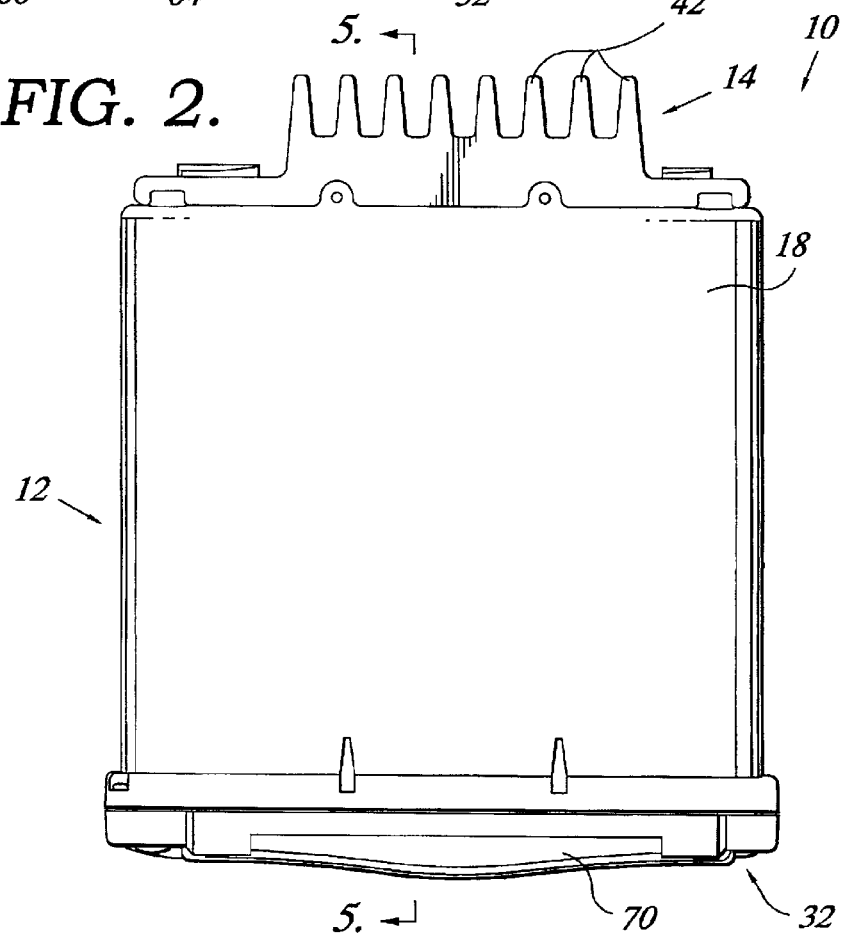
FIG. 2 is a plan view of the present invention as seen in FIG. 1.

Referring to the drawings in greater detail, and initially to FIG. 1, an exemplary electronic enclosure device employing the principles of the present invention is shown and designated generally by reference numeral 10. In its most basic configuration, apparatus 10 includes a housing 12 and a heat sink 14. Housing 12 is adapted to waterproof electronics 16 as best seen in FIG. 8. Heat sink 14 may be removably or fixedly mounted to housing 12 by any number of means known in the art so long as heat is transferred from housing 12, through heat sink 14 and into the external environment.

Figure 5:
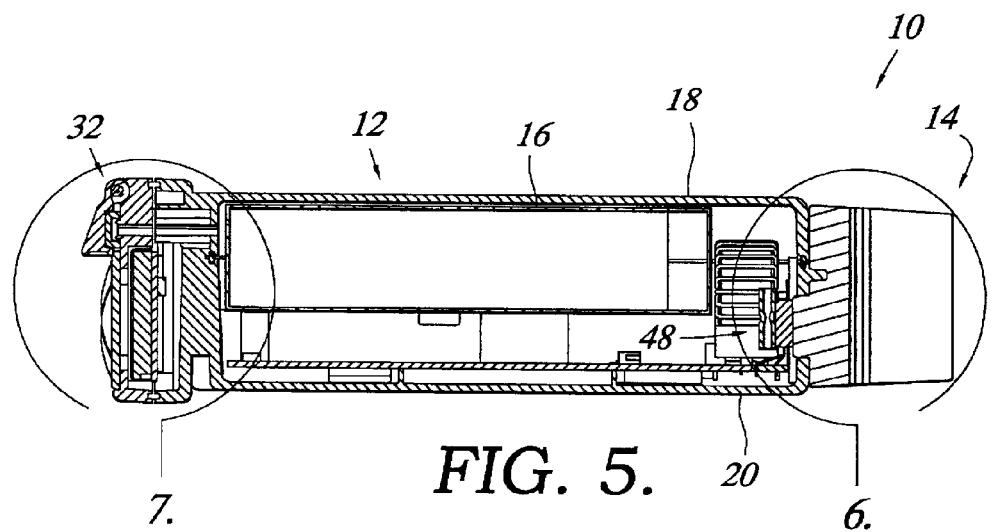
FIG. 5 is a cross-sectional view taken generally along line 5—5 in FIG. 2 showing the electronic device mounted within the housing with the heat sink coupled thereto.

As best seen in FIGS. 1 and 5, housing 12 is generally a hollow box enclosure that includes top and bottom pieces 18, 20. Top and bottom pieces 18, 20 are preferably formed of a plastic material, but it should be understood that pieces 18, 20 could be formed of any other water resistant material. Top and bottom pieces 18, 20 are adapted to interact with each other to form a barrier or shell that prevents water from penetrating into an interior portion of housing 12. The interior portion is the space within the shell formed between top and bottom pieces 18, 20 that provides for a waterproof environment for electronics 16 which will be more fully discussed below.

It will be understood and appreciated that the principles of the present invention apply to various types of electronic devices including, but not limited to, compact disc players, cassette players, MP3 players, radios, televisions, sonar and radar instruments, GPS receivers, communication devices and the like. The size of housing 12 in the accompanying drawings is merely for illustration purposes and it will be understood and appreciated that the housing could take various types of shapes and sizes depending on the type of electronics that are mounted therein.

Figure 3:
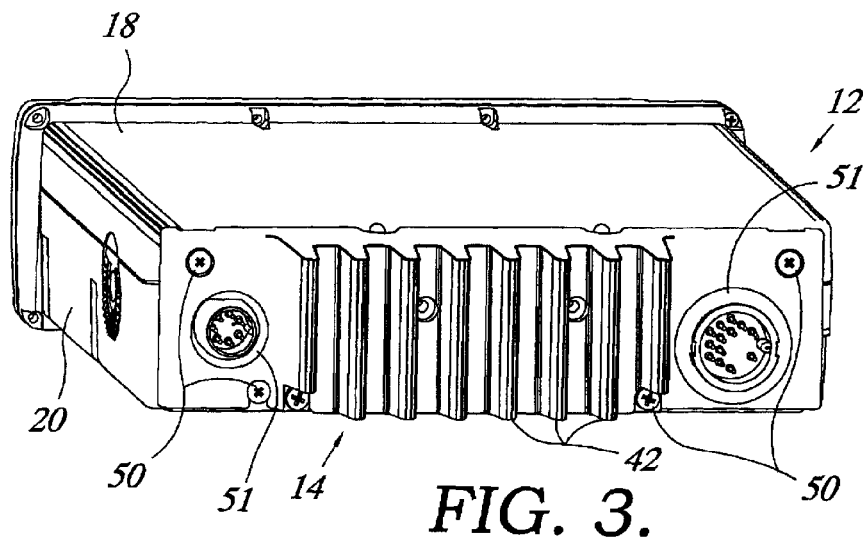
FIG. 3 is a rear perspective view of a housing having a heat sink coupled thereto.
Figure 6:
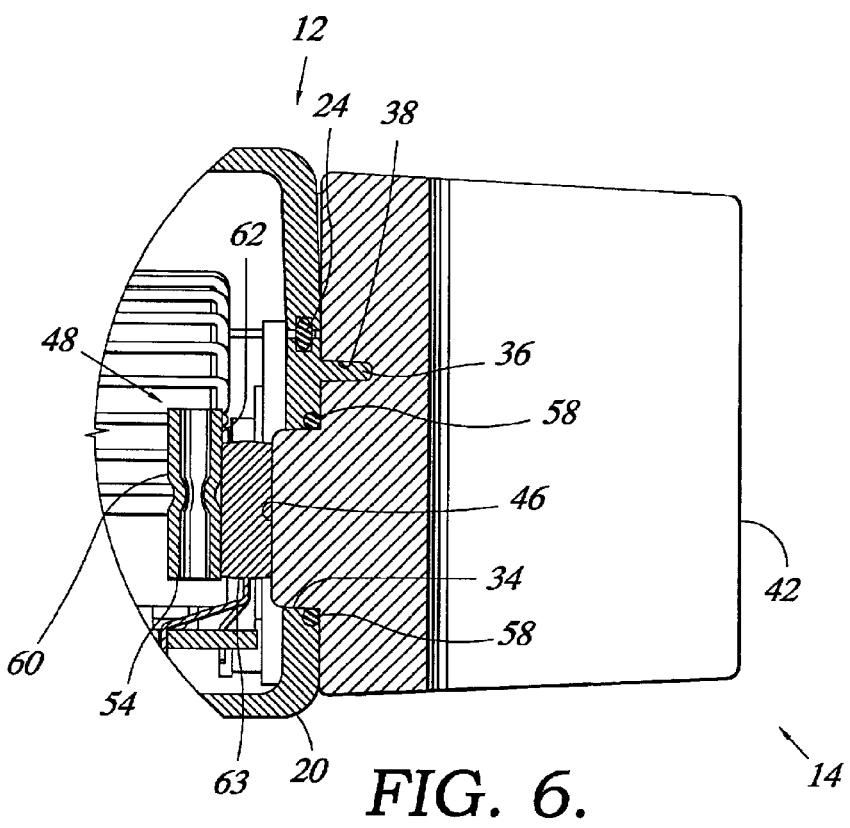
FIG. 6 is an enlarged view of the area encompassed by line "FIG. 6" of FIG. 5 showing the fastening device coupling the heat sink to the housing.

Top and bottom pieces 18, 20 are adapted to mate with one another to form a water-tight environment for electronics 16. As best seen in FIGS. 1, 3 and 6, top and bottom pieces 18, 20 each have an outer rim that are adapted to abut one another to form a seam 22 that extends around the circumference of housing 12. As best seen in FIGS. 5 and 6, a gasket 24 is positioned between top and bottom portions 18, 20 and is used to prevent water from flowing through seam 22. Specifically, gasket 24 is adapted to extend around the rim of top and bottom pieces 18, 20 and is squeezed within the grooves formed in the rim of top and bottom pieces 18, 20. Gasket 24 is formed of rubber, neoprene or any other material having foam-like characteristics that resist the passage of water into the interior portion of housing 12.

Figure 4:
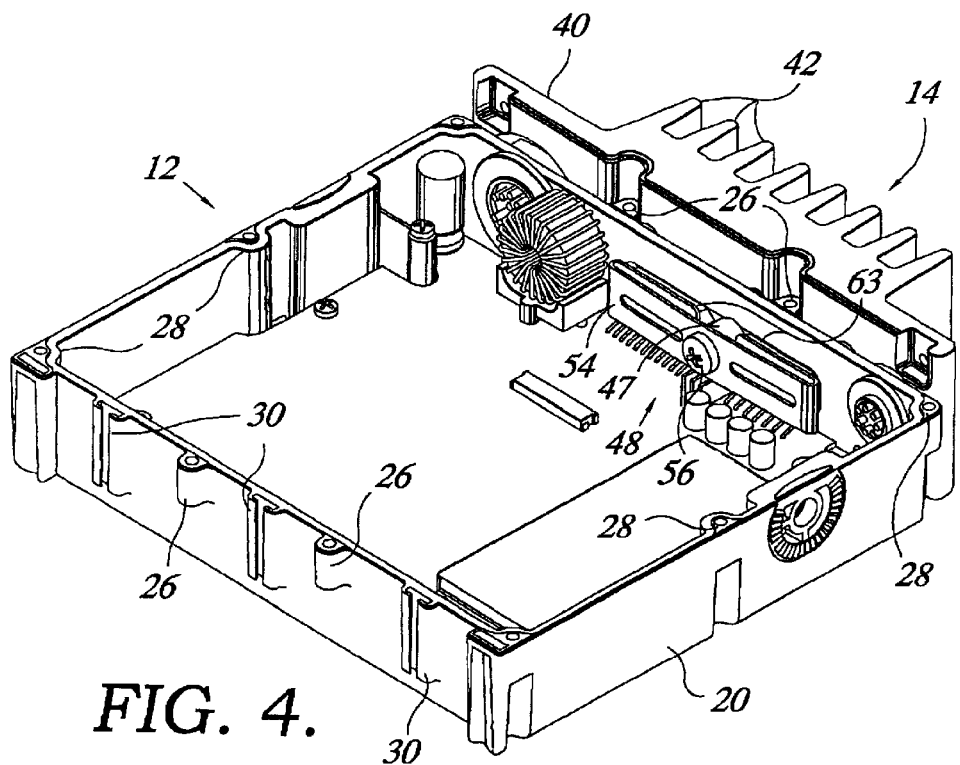
FIG. 4 is a front perspective view with the top portion of the housing, the face plate and the electronic device removed to better illustrate the fastening member coupling the heat sink to the bottom piece of the housing.

As best seen on FIGS. 4 and 8, top and bottom portions 18, 20 are removably secured to one another by a plurality of fasteners (not shown). It will be understood and appreciated that the fasteners used to couple top and bottom portions 18, 20 can be screws, pins, or the like. The fasteners are adapted to fit through a plurality of apertures formed in top and bottom pieces 18, 20. In particular, the apertures are formed in a set of protrusions 26 that extend from the front and back of pieces 18, 20. Further, apertures are also formed in a set of indentations 28 located in the right side, left side and in each corner of pieces 18, 20. The apertures formed in protrusions 26 and indentations 28 are adapted to align with one another when top and bottom pieces 18, 20 are joined to form housing 12. In addition, as best seen in FIG. 8, a plurality of clasps 30 are fixedly mounted to the front wall of housing 12 and are adapted to removably or fixedly couple a face plate 32 to housing 12 which will be more fully described below.

Further, as best seen in FIG. 6, an aperture 34 is formed in the back wall of bottom piece 20 and is adapted to accept heat sink 14 which will be more fully discussed below. A ridge 36 protrudes from the back wall of bottom piece 20 and is used to prevent heat sink 14 from shifting or rotating on housing 12 once heat sink 14 is coupled to the bottom piece 20. Ridge 36 is adapted to rest within a channel 38 formed in heat sink 14 which will be more fully described below.

As best seen in FIGS. 2–4 and 8, heat sink 14 is adapted to be coupled to the back wall of housing 12 and is used to transfer heat from within the interior portion of housing 12 to an external environment. Heat sink 14 is preferably formed of metal, but it should be understood that heat sink could be formed of any other material with a thermal conductivity that allows for an adequate transfer of heat from housing 12 to the exterior environment. Heat sink 14 includes a base 40 with a series of fins 42 extending therefrom. Base 40 preferably makes contact with a substantial portion of the back wall of housing 12 and extends slightly beyond the top edge of bottom piece 20. Base 40 includes indentations that are formed around protrusions 26 that are formed in the back wall of housing 12. The indentations in base 40 preferably extend around protrusions 26 in such a way to remain in contact with protrusions 26 to increase the amount of surface contact between housing 12 and heat sink 14, but it should be understood that the indentations in base 40 do not necessarily have to be in contact with protrusions 26.

Fins 42 extend outwardly from base 40 and provide a heat exchange surface between the apparatus 10 and the external environment Fins 42 are arranged vertically and spaced apart at a distance that allows the air from the exterior environment to flow in between fins 42. Fins 42 are used to increase the amount of surface area of the heat sink 14 that is exposed to the external environment. An increase in the amount of surface area in contact with the external environment allows for an increase in the heat exchange rate between the interior portion of the housing 12 and the external environment. Therefore, it should be understood that it is within the scope of this invention to change the size and quantity of fins 42 formed in heat sink 14 depending on the amount of heat produced by electronics 16 and the desired heat exchange rate between housing 12 and the external environment.

As best seen in FIG. 6, channel 38 is formed within heat sink 14 and is adapted to accept ridge 36. Channel is adapted to fit snugly around ridge 36 to prevent heat sink 14 from shifting or rotating after being coupled to housing 12. A protuberance 46 extends from base 40 and is adapted to fit within the aperture in the back wall of bottom piece 20. A protuberance 47 is also integrally formed with heat sink 14 and extends out from protuberance 46 of heat sink 14. Protuberance 47 is adapted to accept a fastening member 48. In addition, as best seen in FIG. 3, a plurality of apertures are formed in the top and bottom edges of base 40 and are adapted to match up with a corresponding number of apertures formed in top and bottom pieces 18, 20. Apertures are adapted to accept fasteners 50 that are used to couple heat sink 14 to top and bottom pieces 18, 20. Heat sink 14 may also include one or more apertures formed therein to allow access to one or more input and output ports 51 that allow electronics 16 to be coupled to various types of external electronic components such as, but not limited to, a power source, speakers and the like.

As best seen in FIGS. 4, 6 and 8, fastening member 48 is used to couple heat sink 14 to housing 12. Fastening member 48 includes a clip 54, a screw 56 and a gasket 58. Gasket 58 is adapted to be held into place by heat sink 14 in the inside edge of aperture 34 and is adapted to form a water-tight seal between heat sink 14 and bottom piece 20 which will be more fully described below.

Clip 54 is generally an elongated C-shaped member that includes an inner portion 60 and two outer portions 62. Clip 54 is preferably formed of metal, but it should be understood that other types of materials may be used. The two outer portions 62 are adapted to interact with electronic components or other sources of heat 63 that are positioned between clip 54 and protuberance 46, and on opposite sides of protuberance 47. In particular, electronic components 63 include a audio power amplifier and a regulator which generate a substantial amount of heat inside electronic enclosure 10. Since the audio power amplifier and regulator generate most of the heat within enclosure 10, it is preferable to couple these electronic components 63 directly to heat sink 14 to allow the heat generated to move into heat sink 14 and into the external a environment. Inner portion 60 is adapted to interact with screw 56. Specifically, clip 54 includes an aperture formed in inner portion 60 that has approximately the same diameter as the channel that extends through gasket 58 and is adapted to allow screw 56 to pass threrthrough. Screw 56 is preferably threaded and is adapted to extend through the aperture in the inner portion of clip 54, the aperture 34 in the back wall of housing 12 and protuberance 47 in heat sink 14. The threads on screw 56 are adapted to mate with the threads formed in protuberance 47 in heat sink 14.

As best seen in FIG. 8, face plate 32 is used to control electronics 16 and is removably coupled to the front wall of housing 12 by clasps 30. Clasps 30 are fixedly mounted on opposite sides of the front wall of housing 12. Face plate 32 includes a receiving member, not shown, that is adapted to accept clasps 30 so that face plate 32 can be fixedly mounted to housing 12. As best seen in FIG. 7, a gasket 65 is adapted to fit within a pair of grooves formed in face plate 32 and housing 12 to form a water-tight seal when face plate 32 is coupled to housing 12.

As best seen in FIG. 1, face plate 32 typically includes a display 64 having buttons, knobs or other function keys 66 thereon. Buttons, knobs or other function keys 66 are coupled to electrical device 16 through an electrical interface that allows a user to control the operation of electrical device 16. In addition, as best seen in FIG. 7, face plate 32 also typically includes one or more openings 68 adapted to receive various components or accessories such as compact discs, cassettes, or the like. It will be understood and appreciated that the principles of the present invention equally apply to other types of openings in electronicss including, but not limited to, openings for accepting communication devices and openings formed around the circumference of buttons, knobs, or other function keys on the display. Such variations are contemplated to be within the scope hereof.

As best seen in FIG. 1, opening 68 in face plate 32 is covered by a door 70 which provides a water-tight seal over the opening 68 preventing water from entering the interior portion of housing 12 which will be more fully described below. As best seen in FIG. 7, door 70 is hingedly mounted to face plate 32 to allow for the selective sealing of opening 68. Door 70 includes an inward face 72 and an outward face 74, the outward face being visible when the door is in the closed position. Inward face 72 includes a recess therein sized and shaped for receiving a gasket 76 and one or more fastening devices 78. Gasket 76 and fastening device 78 are coupled within the recess in inward face 72 by means well known in the art. The recess is of a depth that permits gasket 76 and fastening device 78 to interact with opening 68 and one or more receiving members, not shown, located on face plate 32 when door 70 is in its closed position. Receiving member is sized and shaped to be complementary to fastening device 78.

Opening 68 typically includes a lip 80 that extends outwardly from the plane of face plate 32. When door 70 is in its closed position, gasket 76 interacts with a lip 80 and opening 68 to provide a water-tight seal. Fastening device 78 is used to selectively couple door 70 to the receiving member depending on whether the door is in its open or closed position.

Fastening device 78 is preferably formed from a metallic material which is capable of being magnetically coupled with the receiving member. It will be understood and appreciated that fastening device 78 may be formed of plastic, rubber or any other such material so long as the fastening device and receiving members 34 are capable of being removably coupled with one another. Preferably, fastening device 78 is fixedly attached within the recess by an adhesive. It will be understood and appreciated, however, that fastening device 78 may be coupled with door 70 by any type of attachment mechanism known in the art including, but not limited to, weldment.

Gasket 76 is rectangular in shape and extends a horizontal length at least slightly greater than that of opening 68 and is preferably made of a neoprene material. However, it will be understood and appreciated that gasket 76 may be made of any material having foam-like characteristics which also resists the passage of water. In this configuration, gasket 76 snugly covers opening 68. Fastening device 78 engages the receiving members when door 70 is in its closed position. It is within the scope of the present invention to adapt fastening device 78 such that it extends around the entire circumference of gasket 76 rather than just two sides thereof.

As best seen in FIG. 1, door 70 is generally rectangular with rounded corners and is sized to cover an area at least slightly greater than opening 68. Door 70 may also cover one or more functional keys, for instance, accessory eject buttons, to prevent the ejection of the accessory when the door is in the closed position. It will be understood and appreciated that door 70 may be sized to cover any number of features of the electronics as desired so long as it is large enough to permit the snug engagement between opening 68 and gasket 76. All such variations are contemplated to be within the scope hereof.

In assembling apparatus 10 and as shown in FIG. 6, gasket 58 is mounted in the rim of aperture 34 formed in the back wall of bottom piece 20. Base 40 of heat sink 14 is placed in contact with the back wall of bottom piece 20 so that indentations 28 in heat sink 14 fit around the protrusions 26 formed in housing 12. Protuberance 46 is inserted into aperture 34 in such a way that gasket 34 is squeezed between heat sink 14 and housing 12. The gasket 24 allows for a water tight seal that prevents water from flowing between housing 12 and heat sink 14. Ridge 36 is inserted into channel 38 to prevent any shifting or rotation by heat sink 14.

Components 63 are placed against the back wall of bottom piece 20 and outer portions 62 are placed in contact with components 63. Screw 56 is inserted in the aperture formed in inner portion 60 of clip 54 into protuberance 47 and rotated so that the threads on screw 56 mesh with the threads formed within the aperture of protuberance 47 of heat sink 14. Screw 56 draws heat sink 14 towards the back wall of housing 12 so that base 40 and bottom piece 20 are in contact with one another. As screw 56 is fastening heat sink 14 to the back wall of bottom piece 20, screw 56 is also securing clip 54 and components 63 against protuberance 46. Specifically, screw 56 is drawing inner portion 60 of clip 54 towards the back wall of bottom piece 20 thereby causing outer portions 62 to squeeze components 63 between outer portions 62 of clip 54 and protuberance 46.

Once fastening device 48 has coupled heat sink 14 to bottom piece 20, electronics 16 are securely mounted within bottom piece 20. Electronics 16 are mounted within bottom piece 20 through the use of one or more fasteners that are adapted to prevent electronics 16 from shifting within the interior portion of housing 12. The fastening of electronics 16 within bottom piece 20 is well known in the art and need not be discussed any further.

As best seen in FIG. 6, gasket 24 is positioned around the rim and within the groove formed in of bottom piece 20. The rims of top and bottom pieces 18, 20 are aligned and are positioned so gasket 24 is positioned between top and bottom pieces 18, 20. The apertures formed in protrusions 26 and indentations 28 are aligned with one another and screws, pins or other fastening members are inserted into the apertures to securely couple top and bottom pieces 18, 20. The screws or other fastening members are tightened to squeeze gasket 24 between the rims of top and bottom pieces 18, 20 so that no water can enter through seam 22 formed between pieces 18, 20 and into the interior portion of housing 12. It is also within the scope of this invention to couple top and bottom pieces 18, 20 and then apply a seal around seam 22 to prevent water from entering housing 12. Seam 22 can be sealed by a plastic material, polymeric material, glue, weldment and the like. As best seen in FIG. 3, fasteners 50 are inserted into apertures formed in the edges of heat sink 14 and the corresponding apertures in top and bottom pieces 18, 20 so that heat sink 14 is securely fastened to the back wall of top and bottom pieces 18, 20.

As best seen in FIGS. 5 and 8, face plate 32 is removably attached to the front wall of housing 12. Specifically, face plate 32 is snapped on to clasps 30 thereby electrically connecting face plate 32 with electronics 16 through an electronic interface. Door 70 is hinged to the front of face plate 32 and operates to selectively seal opening 68 in face plate 32 and prevent water from entering therethrough.

Electronic enclosure device 10 is preferably mounted in a watercraft vehicle or in any environment where there is a risk that water will damage an electronic device. Even though it is preferable to mount apparatus 10 in an environment that includes a high risk of water damage to electronics 16, it should be understood that apparatus could be mounted in any type of vehicle or structure regardless of whether water presents a danger to electronics 16. After apparatus 10 is mounted, electronics 16 are coupled to a power source (such as a battery) and other peripheries via input and output ports 51 to permit operation of electronics 16.

Electronics 16 would then be activated by selecting buttons 66 or manipulating a switch on face plate 32 or elsewhere. Door 70 can be opened to insert a compact disk, cassette, component or other accessory into opening 68 in face plate 32. Door 70 is then resealed to prevent water from entering through opening 68 in face plate 32 and into interior portion of housing 12. In particular, door 70 and fastening device 78 are positioned over opening 68 and abut the outer wall of face plate 32. Specifically, a fastening device 78 is positioned above and below opening 68 and is removably coupled with face plate 32 by the receiving member. The receiving member selectively couples fastening device 78 to face plate 32, gasket 76 is positioned against opening 68 causing the lip extending from face plate 32 to depress into gasket 76. Gasket 76 and the lip of opening 68 form a seal which prevents water from entering opening 68. The sealed connection between top and bottom pieces 18, 20 along seam 22 and the assembly of heat sink 14 to housing 12 by fastening member 48 prevent water from entering housing 12 and damaging electronics 16.

In operation, components 63, such as a power amplifier or regulator, produce heat that is transferred to protuberance 46 of heat sink 14 through surface contact The heat moves from protuberance 46 into base 40 and into fins 42 of heat sink 14. The heat contained in fins 42 is transferred to the external environment through the natural connection between fins 42 and the external environment Heat is also transferred to the external environment through base 40 and the exterior surface of housing 12. The heat transfer from the internal portion of housing 12 through heat sink 14 and housing 12 to the external environment is sufficient to regulate the temperature of the interior portion of housing 12 to an acceptable level to prevent electronics from overheating.

Constructed and operated as previously described, the invention provides a housing that encloses electronics and prevents water from entering the interior portion of the housing. In addition, this invention provides a heat sink coupled to the housing to allow for the transfer of heat that is generated by the electronic components located within the interior portion of the housing to an external environment.

In summary, the present invention is directed to a waterproof electronic enclosure that allows for the transfer of heat from the inside of the enclosure to a external environment The present invention has been described in relation to particular embodiment which are intended in all respects to be illustrative rather that restrictive. Alternative embodiments will become apparent to those skilled in the art to which the present invention pertains without departing from its scope.

From the foregoing, it will be seen that this invention is one well-adapted to attain the ends and objects hereinabove set forth together with other advantages which are obvious and inherent to the device. It will be understood that certain features and subcombinations are of utility and may be employed without reference to other features and subcombinations. This is contemplated by and within the scope of the claims.

Having thus described the invention, what is claimed is:

1. A water-resistant electronic device comprising:
   a housing having an interior portion, said housing is adapted to prevent water from entering said interior portion;
   electronics mounted within said interior portion;
   a fastening member; and
   a heat sink, said heat sink adapted to be coupled to said housing by said fastening member, said heat sink comprising a protuberance that extends into said housing and that is coupled to said fastening member, wherein said heat sink is adapted to transfer heat from said interior portion to the external environment.

2. The electronic device as recited in claim 1, further comprising an opening formed in said housing and a door for covering said opening in a sealed manner.

3. The electronic device as recited in claim 2, wherein said door is hinged to said housing.

4. The electronic device as recited in claim 1, wherein said heat sink is in contact with said electronics.

5. The electronic device as recited in claim 4, wherein said electronics comprise an audio power amplifier.

6. The electronic device as recited in claim 4, wherein said electronics comprise a regulator.

7. The electronic device as recited in claim 1, wherein said heat sink includes a base and a fin.

8. The electronic device as recited in claim 7, wherein a substantial portion of said base is in direct contact with said housing.

9. The electronic device as recited in claim 1, wherein said fastening member includes a screw and a clip.

10. The electronic device as recited in claim 1, wherein said housing includes a top and a bottom piece, wherein said top and bottom pieces are sealed to prevent water from entering the interior portion of said housing.

11. The electronic device as recited in claim 10, further comprising a gasket that is used to seal said top and bottom pieces to prevent water from entering the interior portion of said housing.

12. The electronic device as recited in claim 1, wherein the electronic device comprises a Global Positioning System receiver.

13. The electronic device as recited in claim 1, wherein the electronic device comprises a communications device.

14. The electronic device as recited in claim 1, wherein the electronic device comprises a music player.

15. The electronic device as recited in claim 1, wherein said housing is formed of plastic.

16. A water-resistant electronic device comprising:
   a housing having an interior portion, said housing is adapted to prevent water from entering said interior portion;
   electronics mounted within said interior portion;
   a face plate coupled to said housing; and
   a heat sink, said heat sink adapted to be coupled to said housing, wherein said heat sink is adapted to transfer heat from said interior portion to the external environment, wherein said face plate has an opening formed therein and a door that is coupled to said face plate and is adapted to cover said opening in a sealed manner.

17. The electronic device as recited in claim 16, said face plate adapted to selectively control said electronics.

18. The electronic device as recited in claim 16, wherein said door is hinged to said face plate.

19. A water-resistant electronic device comprising:
   a housing having first and second sections, said first and second sections are adapted to be sealed together to form an interior portion, said interior portion is adapted to prevent water from entering therein;
   an electronic component, said electronic component is adapted to be mounted in said interior portion
   a fastening mechanism; and
   a heat sink comprising a protuberance that extends into said housing and is coupled to said fastening mechanism, said heat sink adapted to be coupled to said housing by said fastening mechanism, said heat sink adapted to be coupled with said electronic component, wherein said heat sink is adapted to transfer the heat that is generated by the electronic device to an external environment.

20. The electronic device as recited in claim 19, further comprising an opening formed in said housing and a door for covering said opening in a sealed manner.

21. The electronic device as recited in claim 20, wherein said door is hinged to said housing.

22. The electronic device as recited in claim 19, wherein said heat sink is in contact with said electronic component.

23. The electronic device as recited in claim 22, wherein said electronic component is a audio power amplifier.

24. The electronic device as recited in claim 22, wherein said electronic component is a regulator.

25. The electronic device as recited in claim 19, wherein said heat sink includes a base and a fin.

26. The electronic device as recited in claim 25, wherein a substantial portion of said base is in direct contact with said housing.

27. The electronic device as recited in claim 19, wherein said fastening mechanism includes a screw and a clip.

28. The electronic device as recited in claim 19, further comprising a gasket that is used to seal said top and bottom pieces to prevent water from entering the interior portion of said housing.

29. The electronic device as recited in claim 19, wherein the electronic device comprises a Global Positioning System receiver.

30. The electronic device as recited in claim 19, wherein the electronic device comprises a communications device.

31. The electronic device as recited in claim 19, wherein said housing is formed of plastic.

32. The electronic device as recited in claim 19, wherein the electronic device comprises a music player.

33. A water-resistant electronic device comprising:
   a housing having first and second sections, said first and second sections are adapted to be sealed together to form an interior portion, said interior portion is adapted to prevent water from entering therein;
   an electronic component, said electronic component is adapted to be mounted in said interior portion;
   a face plate coupled to said housing; and
   a heat sink, said heat sink adapted to be coupled to said housing and is adapted to be coupled with said electronic component, wherein said heat sink is adapted to transfer the heat that is generated by the electronic device to an external environment, wherein said face plate includes an opening and a hinged door for covering said opening in a sealed manner.

34. The electronic device as recited in claim 33, wherein said face plate is adapted to selectively control the electronic device.

35. A method for forming a water-resistant enclosure for an electronic device, said device includes a housing, an electronic component and a heat sink coupled to said housing by a fastening member, said heat sink including a protuberance that is in contact with said fastening member, wherein said housing is adapted to seal said electronic component within said housing, wherein said heat sink is adapted to be coupled within said housing and allow for the transfer of heat generated by said electronic component within said housing to the external environment, the method comprising the steps of:

mounting said electronic component in the housing;

sealing the housing in such a way to prevent water from entering the housing; and coupling the heat sink to said electronic component.

36. The method as recited in claim 35, wherein said housing includes a first and a second section, said first and second sections are adapted to be sealed together to form an interior portion, wherein said interior portion is adapted to allow said electronic component to be mounted therein.

37. The method as recited in claim 35, further comprising a gasket adapted to provide a water-tight seal between said first and second pieces.

38. The method as recited in claim 35, wherein said heat sink includes a base and a fin.

39. The method as recited in claim 38, wherein a substantial portion of the base is in contact with said housing.

40. The electronic device as recited in claim 35, wherein the electronic device comprises a Global Positioning System receiver.

41. The electronic device as recited in claim 35, wherein the electronic device comprises a communications device.

42. The electronic device as recited in claim 35, wherein the electronic device comprises a music player.

43. The electronic device as recited in claim 35, wherein said electronic component is a audio power amplifier.

44. The electronic device as recited in claim 35, wherein said electronic component is a regulator.

45. A water-resistant electronic device comprising:

a housing having an interior portion, said housing is adapted to prevent water from entering said interior portion;

electronics mounted within said interior portion;

a heat sink, said heat sink adapted to be coupled to an exterior of said housing, wherein said heat sink is adapted to transfer heat from said interior portion to the external environment;

a screw;

a clip, said screw and said clip securing said heat sink to said housing; and a gasket positioned between said heat sink and said housing, said gasket providing a water-tight seal between said heat sink and said interior portion of said housing.

46. The electronic device as recited in claim 45, wherein said gasket is mounted in a rim of an aperture formed in said housing, said heat sink being inserted into said aperture.

47. The electronic device as recited in claim 45, wherein said heat sink is inserted into an aperture formed in said housing.

48. The electronic device as recited in claim 45, wherein said heat sink includes a protuberance that extends into said interior portion of said housing to transfer heat from said electronics.

49. The electronic device as recited in claim 45, wherein said housing includes separate top and bottom pieces, wherein said top and bottom pieces are sealed to one another to prevent water from entering the interior portion of said housing.

50. The electronic device as recited in claim 49, further comprising a gasket that seals said top and bottom pieces together to prevent water from entering said interior portion of said housing.

51. An enclosure for electronic components comprising:

a housing comprising an interior portion and an opening formed in said housing into said interior portion, said housing comprising separate top and bottom pieces, said top and bottom pieces sealed to one another, said housing being adapted to prevent water from entering said ulterior portion;

a door attached to said housing, said door sealably covering said opening and being moveable between open and closed positions; and a heat sink sealably coupled to an exterior of said housing, wherein said heat sink transfers heat from said interior portion to the external environment.

52. The enclosure as recited in claim 51, wherein said door is hinged to said housing and, when closed, forms a snug engagement with said housing about said opening.

53. The enclosure as recited in claim 52, further comprising a door gasket provided between and forming a compression seal with said door and said housing.

* * * * *